United States Patent
Feld

[19]

[11] Patent Number: 5,550,471
[45] Date of Patent: Aug. 27, 1996

[54] ANTENNA CABLE FOR A DIAGNOSTIC MAGNETIC RESONANCE APPARATUS

[75] Inventor: Peter Feld, Nurenberg, Germany

[73] Assignee: Siemens Aktiengesellschaft, Munich, Germany

[21] Appl. No.: 332,787

[22] Filed: Nov. 2, 1994

[30] Foreign Application Priority Data

Nov. 8, 1993 [DE] Germany ............ 43 37 908.7

[51] Int. Cl.⁶ ..................................... G01R 33/20
[52] U.S. Cl. ........................ 324/318; 128/653.5
[58] Field of Search .................... 324/300, 318, 324/322; 128/653.5

[56] References Cited

U.S. PATENT DOCUMENTS

| | | | |
|---|---|---|---|
| 4,793,356 | 12/1988 | Misic et al. | 324/318 |
| 4,920,318 | 4/1990 | Misic et al. | 324/318 |
| 5,045,793 | 9/1991 | Rathke | 324/318 |
| 5,059,906 | 10/1991 | Yamanaka | 324/318 |
| 5,065,760 | 11/1991 | Krause et al. | 324/318 |
| 5,150,054 | 9/1992 | Dupree | 324/318 |
| 5,261,403 | 11/1993 | Saito et al. | 324/318 |
| 5,296,813 | 3/1994 | Holmes et al. | 324/322 |
| 5,351,688 | 10/1994 | Jones | 324/322 |
| 5,435,302 | 7/1995 | Lenkinski et al. | 324/318 |

*Primary Examiner*—Sandra L. O'Shea
*Assistant Examiner*—Raymond Y. Mah
*Attorney, Agent, or Firm*—Hill, Steadman & Simpson

[57] ABSTRACT

In a diagnostic magnetic resonance apparatus having a housing in which a patient is disposed for conducting a magnetic resonance examination, a cable is provided for connecting the antenna which receives the high-frequency magnetic resonance signals and forwards those signals to the processing electronics. One end of the cable is guided into the housing which surrounds the patient, and an opposite end of the cable is connected to the antenna by a plug-type connector. A part of the plug-type connector at the cable side contains at least one pre-amplifier for amplifying the received magnetic resonance signals.

1 Claim, 2 Drawing Sheets

ANTENNA CABLE FOR A DIAGNOSTIC MAGNETIC RESONANCE APPARATUS

BACKGROUND OF THE INVENTION

1. Field of the Invention

The present invention is directed to a diagnostic magnetic resonance apparatus, and in particular to an apparatus of the type having an examination part in which a patient is at least partially surrounded by a housing, and a freely movable reception antenna for receiving high-frequency magnetic resonance signals during an examination, the reception antenna having a pluggable, flexible cable connected thereto by means of which the antenna forwards the received magnetic resonance signals to processing circuitry.

2. Description of the Prior Art

In diagnostic magnetic resonance systems (NMR systems), specific reception antennas are used in addition whole body antennas for receiving the high-frequency magnetic resonance signals which arise during the course of an examination. The signals are processed by processing circuitry in order to generate a tomogram of regions of the human body such as, for example, tomograms of the knee, the head, or the eye. Such reception antennas are also known as local antennas or surface antennas. Local antennas offer a better signal-to-noise ratio compared to whole body antennas. Local antennas are often freely movable, and are connected to the processing circuitry contained in the examination apparatus via a flexible cable.

In known systems, the connecting cable is rigidly connected to the local antenna, and is provided with a plug-type unit at its opposite end, by means of which the user can connect the local antenna to a reception channel inside the housing of the examination part.

The term "rigidly connected" as used herein means that the connecting cable cannot be separated from the local antenna in the course of normal use. A pre-amplifier for amplifying the nuclear magnetic resonance signals is arranged in this known system in the housing of the examination part itself, immediately following the plug-type device. This arrangement has the advantage of providing only one pre-amplifier which can be used for the connection of all of the various local antennas, however, the signal-to-noise ratio is degraded by the attenuation of the intervening cables and conductor sections.

In another known solution, which is more complicated, a pre-amplifier is built into the housing of each local antenna. Again, the connecting cable is rigidly connected to the local antenna, and has a plug-type unit at the opposite end. Compared to the former arrangement, in the latter arrangement the signal-to-noise ratio is increased only by the noise factor of the pre-amplifier, due to the absence of intervening connecting lines.

SUMMARY OF THE INVENTION

The present invention is to provide a cable for connecting a freely movable reception antenna in a magnetic resonance apparatus to the signal processing electronics, which has a simple structure and which maintains a low signal-to-noise ratio.

The above object is achieved in accordance with the principles of the present invention in a magnetic resonance apparatus having an antenna cable with one end of the connecting cable conducted into the housing of the examination apparatus, and an opposite end of the connecting cable being connected to the reception antenna by means of a plug-type connector, with a portion of the plug-type connector at the cable side containing at least one pre-amplifier for amplifying the received nuclear magnetic resonance signals. Only one reception amplifier for different local antennas is necessary in this connection strategy for freely movable reception antennas. The signal-to-noise ratio is nonetheless degraded only by the noise associated with the pre-amplifier, and the cable connection between the surface coil and the examination part does not additionally degrade the signal-to-noise ratio. A further advantage is that surface coils without permanently connected cables are easier to manipulate than in the embodiments discussed above known in the art which employ rigidly connected cables.

DESCRIPTION OF THE PREFERRED EMBODIMENTS

Figure 1:
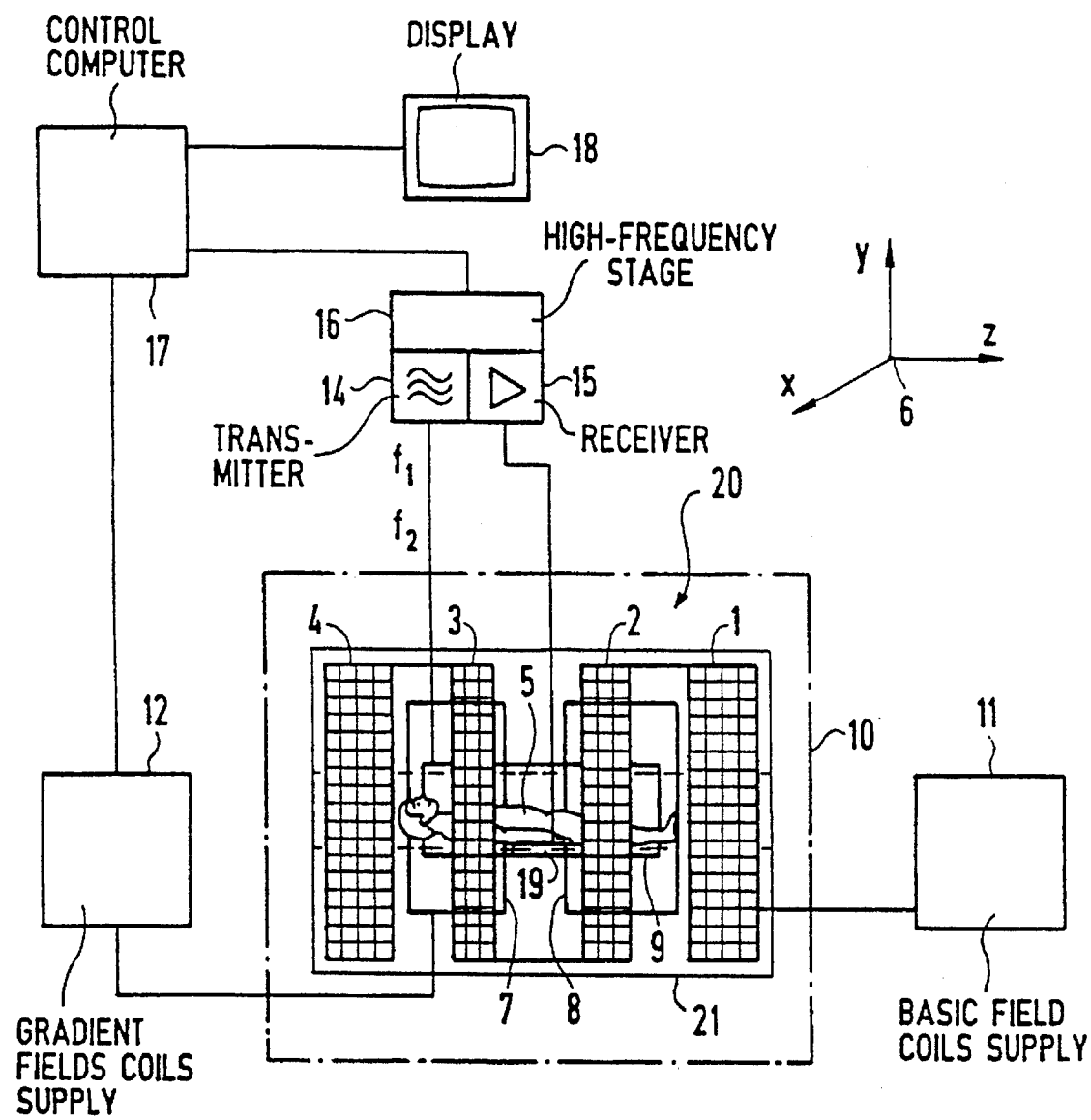
FIG. 1 is a schematic block diagram of a known magnetic resonance apparatus for use in imaging and spectroscopy, in which the cable of the invention can be employed.

In the known magnetic resonance apparatus shown in FIG. 1, coils 1, 2, 3 and 4 generate a basic magnetic field $B_0$, wherein the body 5 of a patient to be examined is situated (given a medical application of the apparatus). Gradient coils are also provided which respectively generate independent orthogonal magnetic field gradients in the x, y and z directions of a Cartesian coordinate system 6, superimposed on the basic field $B_0$. For clarity, only gradient coils 7 and 8 are shown in FIG. 1, which generate a gradient in the x-direction in combination with a pair of identical gradient coils disposed opposite to the coil 7 and 8. A similar set of gradient coils (not shown) are disposed parallel to the body 5, above and below the body 5, for generating a gradient in the y-direction. Another set of gradient coils (not shown) are disposed at the head and feet of the body 5 of the patient, for generating a gradient field in the z-direction. These gradient coils extend transversely relative to the longitudinal axis of the body 5. The arrangement also includes a whole body antenna 9 for exciting spins in the body 5 of the patient, which in turn generate the magnetic resonance signals. A local antenna 19 is provided for receiving the magnetic resonance signals.

The actual examination part 20 is composed of the coils 1, 2, 3, 4, 7 and 8 (and the other gradient coils) surrounded by a dot-dashed line 10, as well as the whole body antenna 9. The examination part 20 is at least partially clad with a housing 21 that encompasses an examination space for the acceptance of the patient. The local antenna 19 is also connected to the examination part 20. A power supply 11 is provided for operating the coils 1–4. The gradient coils 7 and 8 as well as the further gradient coils are connected to a gradient colt power supply 12. A high-frequency transmitter 14, controlled by a control computer 17, is connected to the whole body antenna 9. The local antenna 19 is coupled to the control computer 17 via a signal amplifier 15, as is the whole body antenna 9. A display 18 is connected to the output of the control computer 17 for portraying an image of the patient, or spectral data. The high-frequency transmitter 14 and the signal amplifier 15 form a high-frequency stage 16 for signal generating and signal pick-up. The stage 16 is switched to an appropriate operating mode depending on whether signal transmission or signal reception is intended.

Figure 2:
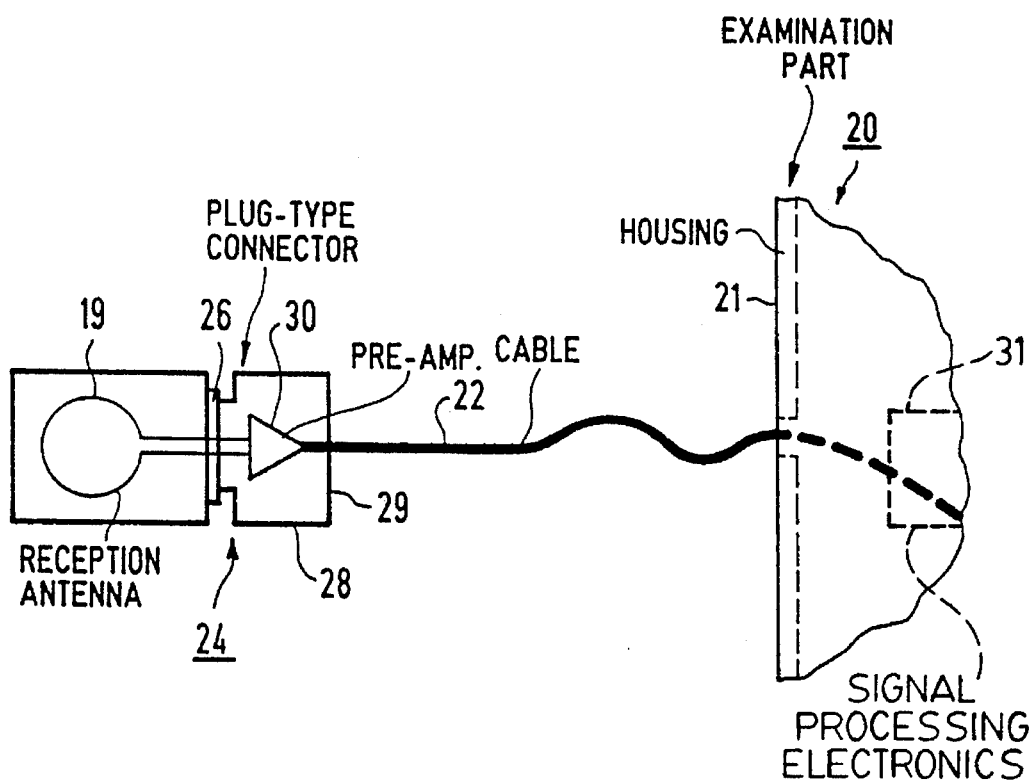
FIG. 2 shows a connection cable constructed in accordance with the principles of the present invention for use with freely movable reception antennas in the apparatus of FIG. 1.

FIG. 2 shows the freely movable reception antenna 19 surrounded by a housing, in which the body 5 is placed in order to examine regions thereof. The reception antenna 19 is connected to the examination part 20 (which is disposed in a shielded chamber defined by the dot-dash line 10) by a pluggable, flexible cable 22. The cable 22 is guided into the housing 21 of the examination part 20 laterally from the examination space in which the patient is disposed, and is connected to a terminal of a motherboard of signal processing electronics 31. To assist in manipulation, this connection is releasable by a service technician, and may be, for example, a plug-type connection. It should be noted, however, that the connection of the cable 22 to the terminal of the motherboard is not accessible to a user without difficulty. A fixed electrical connection (within the shielded chamber) proceeds from the motherboard to the amplifier 15.

The other end of the cable 22 is connected to the reception antenna 19 by means of a plug-type connector 24 which is directly accessible to a user. The plug-type connector 24 has a plug part 26 at the antenna side and a plug part 28 at the cable side. The plug part 28 at the cable side may be the male part of the plug-type connector 24. A pre-amplifier 30, which amplifies the received magnetic resonance signals, is disposed in the housing of the plug part 28. The power supply to the pre-amplifier 30 is conducted via the lines for the transmission of the received high-frequency signals, using coupling and decoupling elements as needed. The cable 22, however, may contain additional lines for supplying power to the pre-amplifier 30.

More than one pre-amplifier 30 can be built into the plug part 28, in which case a simple reception antenna, such as the reception antenna 19, as well as antenna arrays or circularly polarizing antennas, can be connected via the plug-type connector 24, with a corresponding activation of a suitable number of the pre-amplifiers 30. A hybrid unit, for phase shifting and superimposing the reception signals as is necessary in the case of circularly polarizing antennas, can then be arranged in the housing 21 of the examination part 20.

Although modifications and changes may be suggested by those skilled in the art, it is the intention of the inventors to embody within the patent warranted hereon all changes and modifications as reasonably and properly come within the scope of their contribution to the art.

I claim as my invention:

1. A diagnostic magnetic resonance apparatus comprising:

examination means for conducting a nuclear magnetic resonance examination of a subject, said examination means including a housing containing signal processing circuitry;

a freely movable reception antenna for receiving high-frequency magnetic resonance signals for said subject generated by the operation of said examination means; and a flexible cable connecting said reception antenna to said signal processing circuitry, said flexible cable having one end extending into said housing and connected to said signal processing circuitry and an opposite end connected to said reception antenna, and having a plug-type connector at said opposite end making said connection between said flexible cable and said reception antenna, said plug-type connector having a plug part attached to said cable and a plug part attached to said antenna and containing at least one pre-amplifier in said plug part attached to said cable for amplifying the received magnetic resonance signals.

\* \* \* \* \*